| United States Patent [19] | [11] 4,258,077 |
|---|---|
| Mori et al. | [45] Mar. 24, 1981 |

[54] METHOD OF ION IMPLANTATION INTO A SEMICONDUCTOR SUBSTRATE PROVIDED WITH AN INSULATING FILM

[75] Inventors: Haruhisa Mori; Motoo Nakano, both of Yokohama, Japan

[73] Assignee: Fujitsu Limited, Tokyo, Japan

[21] Appl. No.: 88,468

[22] Filed: Oct. 26, 1979

[30] Foreign Application Priority Data

Oct. 30, 1978 [JP] Japan ................... 53-133623

[51] Int. Cl.³ .............................. C23C 17/00
[52] U.S. Cl. .................................... 427/38; 148/1.5; 250/492 A; 250/492 B; 357/23; 357/24; 357/91; 427/82
[58] Field of Search ............... 427/38, 39, 82; 250/492 A, 492 B; 148/1.5; 357/23, 24, 91

[56] References Cited

U.S. PATENT DOCUMENTS

| 3,117,022 | 1/1964 | Bronson et al. | |
|---|---|---|---|
| 3,734,769 | 5/1973 | Hirschfeld . | |
| 4,001,049 | 1/1977 | Baglin et al. | 148/1.5 |
| 4,021,675 | 5/1977 | Shifrin | 148/1.5 |
| 4,076,558 | 2/1978 | Rupprecht et al. | 357/91 |
| 4,088,799 | 5/1978 | Kurtin | 427/38 |
| 4,118,630 | 10/1978 | McKenna et al. | 250/492 A |

*Primary Examiner*—John H. Newsome
*Attorney, Agent, or Firm*—Staas and Halsey

[57] ABSTRACT

In the production of a semiconductor device, such as an IC including MOS transistors, impurity ions are implanted into the semiconductor substrate of the device provided with an insulating film. The insulating film is electrically charged by the impurity ions and may be destroyed due to an electric potential between the insulating film and the semiconductor substrate. A novel process provided by the invention prevents the destruction of the insulating film and shortens the ion implantation time, since the beam current of the impurity ions is successively increased until the required dosing amount is obtained.

12 Claims, 4 Drawing Figures

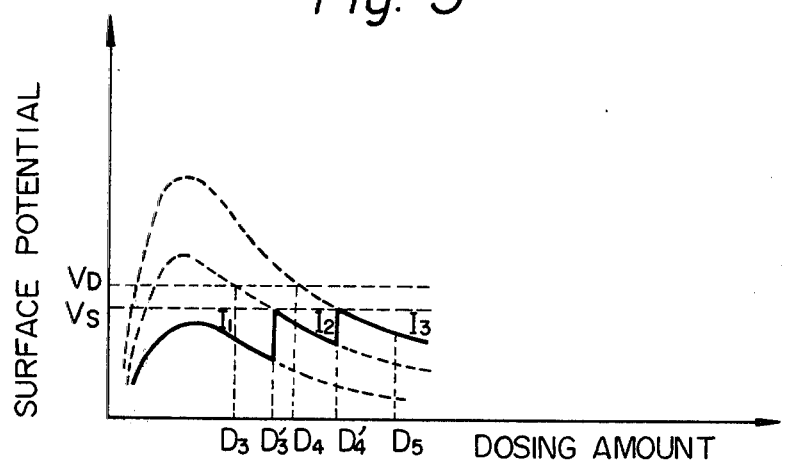
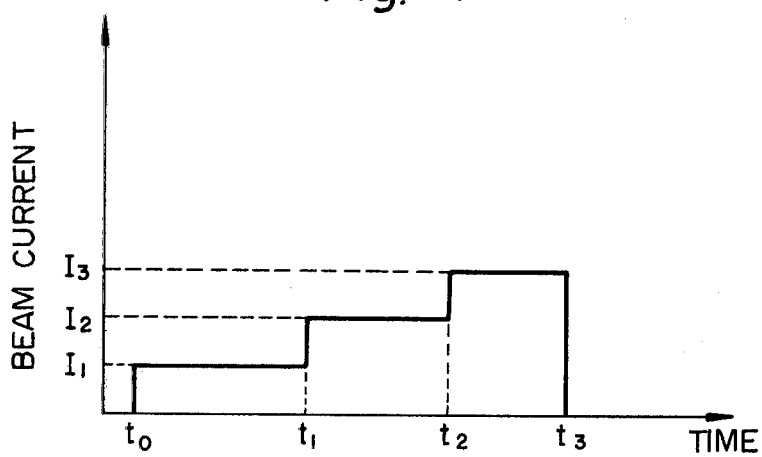

METHOD OF ION IMPLANTATION INTO A SEMICONDUCTOR SUBSTRATE PROVIDED WITH AN INSULATING FILM

BACKGROUND OF THE INVENTION

1. Field of the Invention

The present invention relates to a method of ion implantation into a semiconductor substrate provided with an insulating film.

2. Description of the Prior Art

Ion implantation is an old technique for surface doping of semiconductors and consists essentially of introducing atoms in the surface layer of the semiconductor body by bombardment of the semiconductor body with ions in the KeV to MeV ranges. Ion implantation exhibits the following advantages of an externally controlled, non-equilibrium process.

1. The deposition rate of ions can be varied widely by varying a beam current, for example, from $6 \times 10^9$ ions/sec to $6 \times 10^{16}$ ions/sec.
2. By continuously varying the energy of the ion beam, it is possible to precisely adjust the dopant profile in the semiconductor body.
3. The dosing amount is precisely determined by the product of the beam current and implantation time period.

It is well known in the field of semiconductor engineering that ions are selectively implanted, by using masks of a gate electrode and a thick insulating film, into a semiconductor substrate of semiconductor devices, such as an MOS transistor having a gate insulating film. When a source region and a drain region of the MOS transistor are produced in the process of producing an IC, the gate electrode and the thick insulating film, such as field insulation film, are already formed on the semiconductor substrate. Therefore, the ions must be implanted into the gate electrode and the thick insulating film so that a high dosing amount, which is usually necessary for the source and drain regions, is also imparted to the gate electrode and the thick field insulating film. The electric charges of the ions are, therefore, also imparted to the electrode and film. Since the dosing amount is proportional to the product of the beam current and the implantation time period, either the beam current or the implantation time period must be large in order to provide the necessary high dosing amount. When the implantation time period is long, it is obvious that the efficiency of the ion implantation process is disadvantageously low. On the other hand, when the beam current is high, the insulating film may be destroyed due to the electric discharge of the electric charges between the gate electrode or the surface of the insulating film and the semiconductor substrate. In addition to the gate insulating film, other films, such as a passivation film, particularly a thin portion of a passivation film, may be destroyed due to electric discharges, which are similar to those between the gate electrode and semiconductor substrate.

SUMMARY OF THE INVENTION

It is an object of the present invention to eliminate the disadvantages of the prior method for controlling the dosing amount, wherein either the beam current or the implantation time period is adjusted to provide a necessary dosing amount.

It is an object of an embodiment of the present invention to quickly form a highly doped or dosed region of a semiconductor substrate by an ion implantation process, without destroying a thin insulating film, on which the the gate electrode of an MOS transistor is formed.

In accordance with the objects of the present invention, there is provided a method for ion implantation into a semiconductor substrate on which an insulating film is formed, characterized in that the beam current of the ions is increased at least one time from an initial lower value to a subsequent higher value until a required dosing amount of the ions is obtained and the surface electric potential of the insulating film, which is electrically charged by the ions, is lower than the value at which said insulating film is destroyed.

The insulating film having the surface electric potential mentioned above may be adjacent to a gate electrode of an MOS transistor or a locally thin portion of a field insulating film. The insulation film may be a photoresist layer having a local window, through which ions are implanted into a semiconductor substrate.

BRIEF DESCRIPTION OF THE DRAWINGS

The present invention is explained hereinafter in detail with reference to the drawings, wherein:

FIG. 3 is a graph similar to FIG. 2 and illustrates an embodiment of the ion implantation method according to the present invention, and;

FIG. 4 is a time chart indicating a switching method of a beam current according to an embodiment of the present invention.

DETAILED DESCRIPTION OF PREFERRED EMBODIMENTS

Figure 1:
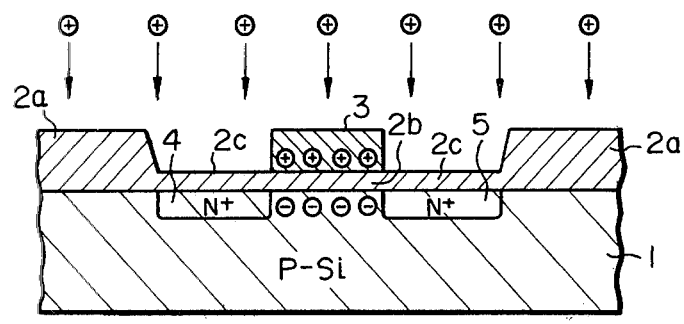
FIG. 1 is a partial cross sectional view of a semiconductor device provided with an insulating film.

Referring to FIG. 1, a cross sectional view of an MOS transistor being produced at one production stage thereof is illustrated. A thick field insulation film 2a of silicon dioxide ($SiO_2$), a thin gate oxide film 2b and a thin oxide film 2c covers a p type silicon substrate 1. The oxide film 2c is simultaneously formed with the gate oxide film 2b and thus has the same thickness as that of the thin gate oxide film 2b. The oxide film 2c is formed at the top position of the p type silicon substrate 1 where the source and drain are to be formed. On the thin gate oxide film 2b a gate electrode 3 of a polycrystalline silicon and the like are deposited. The top positions of the p type silicon substrate 1 denoted by 4 and 5 correspond to the source region and drain region, respectively, to be formed later. In a production method of the MOS transistor as illustrated in FIG. 1, these regions 4 and 5 are directly covered by the thin oxide film 2c and ions are implanted through the thin oxide film 2c. Alternatively, the oxide film 2c may be etched off before the implantation.

Experiments varying the ion implantation conditions are hereinafter explained. Phosphorus ions ($P^+$) and arsenic ions ($As^+$) were implated into the regions 4 and 5 using the field insulation film 2a and the gate electrode 3 as a mask. The phosphorus ions ($p^+$) and arsenic ions ($As^+$) were implanted as indicated by the arrows in FIG. 1. The ions were introduced not only onto the p type silicon substrate 1 through the thin oxide film 2c but, also, into the thick field insulation film 2a and the gate electrode 3. A capacitor was formed at the gate electrode 3, because the surface of the gate oxide film 2b was positively charged due to the positive electric charges of the implanted ions and, further, negative electric charges were induced on the top surface of the p type silicon substrate 1 due to the positive electric charges. The gate electrode 3 and the p type silicon substrate, therefore, acted as the electrodes of the capacitor, and the gate oxide film 2b acted as the dielectric of the capacitor. The charges of the impurity ions, which were bombarded into the gate electrode 3, were occasionally stored on the surface of the gate oxide film 2b to such an extent that the difference in the electric potential between the top and bottom surfaces of the gate oxide film was enhanced to a voltage of 20, 30 or 40, or even to a hundred volts. An electric discharge, therefore, was initiated at a portion of the gate oxide film 2b, which was not highly resistant to voltage. Once the electric discharge was initiated, an avalanche phenomenon was caused, with the result that the all electric charges were discharged through the portion of the gate oxide film 2b mentioned above. The gate oxide film 2b was partly destroyed thermally due to heat generation by the discharging current, and a short circuit finally occurred between the gate electrode 3 and the p type silicon substrate 1. It was, therefore, difficult to implant ions in the heavily doped source and drain regions 4, 5, without causing the destruction of the gate oxide film 2b.

Figure 2:
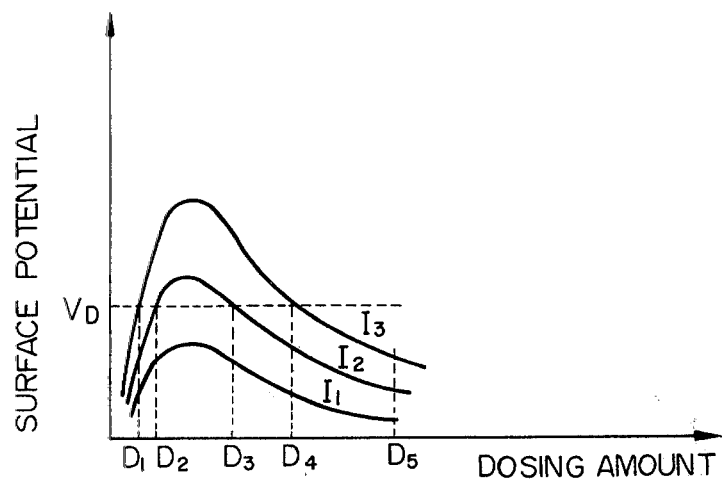
FIG. 2 is a graph indicating the surface potential of the gate electrode of FIG. 1 into which ions are implanted in various dosing amounts.

The oxide films 2a and 2b are hereinafter referred to as an insulating film. When any region of the semiconductor substrate was exposed, for example via scribe lines, to the ion beam, the surface electric potential was low, because the charges of the ions flowed away through the exposed region into the semiconductor substrate. However, when the exposed area of the semiconductor substrate was not so broad as to allow the charges of the ions to flow away, the electric potential of the insulating film tended to vary, as illustrated in FIG. 2, in accordance with the dosing amount of the impurity ions. In FIG. 2, the ordinate indicates the surface electric potential of the insulating film and the parameters $I_1$, $I_2$ and $I_3$ indicate the beam current of the impurity ions. Referring to FIG. 2, when the ion beam current was increased from $I_1$ to $I_2$ and then $I_3$, the surface electric potential of the insulating film was also increased as shown in FIG. 2. At any beam current of $I_1$, $I_2$ and $I_3$, the surface electric potential of the insulating film firstly increased as the dosing amount increased until it reached a peak value and, then, decreased. The curves of the surface electric potential moved upwards as a whole with the increase in the beam current. The term "surface electric potential of an insulating film" used herein indicates a voltage between the semiconductor substrate and the surface of the insulating film. Depending upon the value of the beam current, enormous electric charges were stored on the surface of the insulating film and the semiconductor substrate, so that the surface electric potential exceeded the destruction voltage $V_D$ of the insulating film. Referring to FIG. 2, when the beam current was $I_2$, the surface electric potential exceeded the destruction voltage $V_D$ at a dosing amount range between $D_2$ and $D_3$; while when the beam current was $I_3$, the surface electric potential exceeded the destruction voltage $V_D$ at a dosing amount range between $D_1$ and $D_4$. The reason for the relationship between the dosing amount and the surface electric potential, as illustrated in FIG. 2, is not clear, particularly as to why the surface electric potential arrives at a peak and then decreases. It is estimated however that the electric charges can easily move in the insulating film because the bonding between the silicon and oxygen in the insulating film is destroyed due to the ion implantation. As a result of the high conductivity of the insulating film produced by the destruction mentioned above, the surface electric potential has a tendency to decrease from the peak value. It is possible to achieve the required dosing amount, for example $D_5$, without destroying the insulating film, when the beam current is lower, for example $I_1$, than when the beam current is higher, which increases the surface electric potential to a level higher than the voltage $V_D$ which causes destruction. However, the dosing time period is disadvantageously long at a low beam current.

In order to shorten the time period of ion implantation and simultaneously cause no destruction of the insulating film, the present invention utilizes the phenomenon of the surface electric potential change as illustrated in FIG. 2. The surface electric potential does not present simply an increase in accordance with the dosing amount, but represents a decrease after the maximum surface electric potential is obtained. This fact is utilized in the present invention and the beam current is successively changed from a low value to a high value, in such a manner that the surface electric potential does not exceed the destruction voltage. More in detail, the surface potential is lower than the destruction voltage $V_D$, when the dosing amount at the beam current $I_2$ exceeds the value $D_3$ in FIG. 2. Therefore, the beam current $I_2$ can be used when the dosing amount exceeds the value $D_3$. Furthermore, when the dosing amount at the beam current $I_3$ exceeds the dosing amount $D_4$, the beam current $I_3$ can be used.

In an embodiment of the present invention the maximum beam current, which does not cause the destruction of the insulating film, is used, and the beam current is successively increased as stated above. Assuming that three levels of the beam current $I_1$, $I_2$ and $I_3$ (FIG. 2) can be set in an ion implantation device, the beam current $I_1$ is firstly used until the dosing amount of $D_3$ is obtained. When the dosing amount exceeds $D_3$, the beam current is immediately changed to the value $I_2$, which is the maximum beam current for ion implantation in the insulating film without causing destruction thereof. Similarly, when the dosing amount exceeds the value $D_4$, the beam current is immediately changed to the value $I_3$, which is now the maximum beam current for ion implantation into the insulating film without causing destruction thereof. The maximum beam currents mentioned above can be used, because the insulating film is not destroyed directly after the surface electric potential has arrived at the destruction voltage $V_D$.

In another embodiment of the present invention, the maximum surface electric potential of the insulating film is from 80 to 90% of the value at which the insulating film is destroyed. In this embodiment, the beam current is changed from an initial lower value to a subsequent higher value, when the surface electric potential of the higher value is from 10 to 20% lower than the voltage which destroys, thereby reliably conducting the ion implantation method. Referring to FIG. 3, the value Vs indicates a switching voltage, which is from 10 to 20% lower than the destruction voltage $V_D$. It will be apparent from FIG. 3, that the beam current used for the ion implantation is $I_1$ until the dosing amount of $D_3'$, which is more than the value $D_3$ (FIGS. 2 and 3). Further, the beam current $I_2$ is used until the dosing amount of $D'_4$, which is more than the value $D_4$ (FIGS. 2 and 3) and the beam current $I_3$ is used until the required dosing amount of $D_5$.

It is possible to experimentally determine the curves of surface electric potential as shown in FIGS. 2 and 3, with regard to kinds of the insulating film, such as silicon dioxide and silicon nitride, kinds of impurity ions and thickness of the insulating film. Although the measurement of surface electric potential over the destruction voltage $V_D$ seems to be impossible due to the destruction of the insulating film, the curves of the surface electric potential of an insulating film having a predetermined thickness can be obtained by measuring the surface electric potential of a thick insulating film, which cannot be destroyed, and then reducing this measured value to the value of the insulating film having the predetermined thickness.

Generally, the method of the present invention is suitable for ion implantation into a semiconductor device provided with an insulating film having a thickness of from 50 to 1000 Å. A preferable time period for the ion implantation is 200 sec/wafer or less. The amount of the ions is generally from $10^{15}$ to $10^{16}$ ions/cm$^2$.

In a preferable embodiment of the present invention, a semiconductor silicon substrate having an insulating film is subjected to ion implantation under the following conditions.

A. Thickness of silicon dioxide film:
  400 to 500 Å
B. First Ion implantation
  (1) Beam current: 500 μA
  (2) Dosing amount: from $1 \times 10^{14}$ to $5 \times 10^{14}$ ions/cm$^2$
C. Second Ion Implantation
  (1) Beam current: 1 mA
  (2) Dosing amount: from $2 \times 10^{14}$ to $1 \times 10^{15}$ ions/cm$^2$
D. Third Ion Implantation
  (1) Beam current: 2 mA
  (2) Dosing amount: from $2 \times 10^{15}$ to $1 \times 10^{16}$ ions/cm$^2$ In accordance with the preferable embodiment, the source and drain regions of an MOS transistor, which have high dosing amounts of from $10^{15}$ to $10^{16}$ ions/cm$^2$, can be advantageously produced with a short time period and without destruction of the insulating film. In the embodiments mentioned above, it is necessary to continuously monitor the dosing amount by means of, for example, a current integrator. Practically, it is advantageous to monitor the time period for the ion implantation instead of the dosing amount. In the monitoring of the time period for ion implantation, the dosing amount is reduced to the time period for ion implantation, using the relationship that the dosing amount of ions is proportional to the product of the beam current and the time period for ion implantation. In the monitoring method of the time period, the ion implantation conditions mentioned above may be used except that the time period for ion implantation is monitored instead of monitoring the dosing amount. The time period to be monitored is as follows.

A. First Ion Implantation
  Time period: from 4 to 20 sec/wafer
B. Second Ion Implantation
  Time period: from 4 to 20 sec/wafer -continued C. Third Ion Implantation
  Time period: from 15 to 90 sec/wafer In another preferable embodiment of the present invention, the monitoring of the time period for the ion implantation is automatically controlled. Referring to FIG. 4, at the initial time the ion implantation is started with the beam current $I_1$ (FIG. 3). The final time $t_1$ of ion implanting with a beam current $I_1$ is determined from the equation $D_3' = (1/q \cdot s) \cdot I_1 (t_1 - t_0)$, wherein the values $D_3'$ and $I_1$ (FIG. 3) are predetermined under the kind and thickness of an insulating film, q indicates $1.6 \times 10^{-19}$ Coulomb and S indicates implantation area. The beam current is changed from the value $I_1$ to the value $I_2$ (FIGS. 3 and 4) after the time $t_1$ and, then, from the value $I_2$ to the value $I_3$ (FIGS. 3 and 4) after the time $t_2$, and finally, the beam current is decreased to zero at the time $t_3$, at which time the ion implantation is completed. The times $t_2$ and $t_3$ can be determined from the equations:

$$D_4' - D_3' = (1/q \cdot s) \cdot I_2 (t_2 - t_1); \text{ and};$$

$$D_5 - D_4' = (1/q \cdot s) \cdot I_3 (t_3 - t_2), \text{ respectively}.$$

Since the dosing in amounts corresponding to the differences $D_4' - D_3'$ and $D_5 - D_4'$ are carried out by using the beam currents $I_2$ and $I_3$, which are greater than the beam current $I_1$, the total time is shortened to a time period less than that using only the beam current $I_1$. Furthermore, the beam currents $I_1$ and $I_2$ do not exceed a level that causes the increase of the surface electric potential to be more than the destruction voltage $V_D$. Therefore, the insulating film will not be destroyed. The dosing amount of the ions is monitored by integrating the beam current. A commercial current integrator can be used for the integration of the beam current. When the integrated value of each of the beam currents $I_1$, $I_2$ and $I_3$ exceeds a predetermined value, an initial lower beam current is changed to a subsequent higher beam current.

What we claim is:

1. In the method of ion implantation into a semiconductor substrate through an insulating layer wherein, as a result of said implantation, a surface potential is developed on said insulating layer, the steps comprising:
  beginning said implantation at a maximum ion beam current at which the peak value of the surface potential of said insulating layer is below a destructive level, and;
  thereafter at least once increasing the ion beam current but at all times maintaining said current at a level such that the surface potential remains below said destructive level.

2. A method according to claim 1, said insulating film being adjacent to a gate electrode of an MOS transistor.

3. A method according to claim 1, said insulating film comprising a locally thin portion of a field insulation film.

4. A method according to claim 1, said insulating film comprising a photoresist layer having a window therein.

5. A method according to claim 1 comprising regulating said beam current to maintain the maximum surface electric potential of said insulating film at a valve from 80 to 90% of the value at which said insulating film breaks down.

6. A method according to claim 1 or 5 comprising forming said insulating film to have a thickness of from 60 to 1000 Å.

7. A method according to claim 1 or 5 comprising forming said insulating film to have a thickness from 50 to 1000 Å, and regulating the dosing amount of the ions into said semiconductor substrate from $10^{15}$ to $10^{16}$ ions/cm$^2$.

8. A method according to claim 1 or 5 comprising forming said insulating layer to have a thickness from 50 to 1000 Å, regulating the dosing amount of the ions into said substrate from $10^{15}$ to $10^{16}$ ions/cm$^2$, and controlling the time period of the ion implantation to 200 seconds per substrate or less.

9. The method of claim 1 requiring no more than 200 seconds for implanting up to $10^{16}$ ions/cm$^2$ into a portion of said substrate surface including said insulating layer and said gate electrode.

10. A method of implanting ions into a semiconductor substrate through an insulating layer on a surface of said substrate, said method comprising beginning said implantation at a dose rate at which a destructive surface potential will not develop across said insulating layer and subsequently increasing said dose rate, while keeping the surface potential of said insulating layer at a value below the destructive surface potential of said insulating layer.

11. The method of claim 9 or 10 comprising forming said insulating film to have a thickness in the range from 50 to 1000 angstroms.

12. The method of claim 9 or 10, comprising implanting said ions over and around said insulating layer and said gate electrode to form source and drain regions of an MOS transistor on respective sides of said gate electrode.

* * * * *

UNITED STATES PATENT AND TRADEMARK OFFICE
CERTIFICATE OF CORRECTION

PATENT NO. : 4,258,077

DATED : March 24, 1981

INVENTOR(S) : Mori et al.

It is certified that error appears in the above—identified patent and that said Letters Patent is hereby corrected as shown below:

Column 1, line 36, "field" should be --a field--.
Column 2, line 3, at the beginning of the line delete "the";
  lines 25 and 40, "cross sectional" should be --cross-sectional--;
  line 32, ", and;" should be --; and--;
  lines 44, 48, 52 and 66, "p type" should be --p-type--;
  line 62, "implated" should be --implanted--;
  line 64, "(p$^+$)" should be --(P$^+$)--.
Column 3  lines 6 and 7, "p type" should be --p-type--;
  line 25, change "p" to --p- --.
Column 4  line 20, "change" should be --charge--.
Column 5  line 2, "D'$_4$," should be --D$_4$',--;
  first table, line 3, "implantation" should be --Implantation--.
Column 6  line 10, ". The" should be --, the--;
  line 24, delete the second ";";
  line 52, ", and;" should be --; and--;
  line 66, after "claim 1" insert --,--.
Column 7  lines 7 and 12, after "thickness" insert --of--.

Signed and Sealed this

Eleventh Day of August 1981

[SEAL]

Attest:

GERALD J. MOSSINGHOFF

Attesting Officer   Commissioner of Patents and Trademarks

UNITED STATES PATENT AND TRADEMARK OFFICE
CERTIFICATE OF CORRECTION

PATENT NO. : 4,258,077
DATED : 24 March 1981
INVENTOR(S) : Mori et al.

It is certified that error appears in the above—identified patent and that said Letters Patent is hereby corrected as shown below:

[73] Assignee: "Tokyo" should be --Kawasaki--.

*Signed and Sealed this*

*Ninth* Day of *February 1982*

[SEAL]

*Attest:*

GERALD J. MOSSINGHOFF

*Attesting Officer*     *Commissioner of Patents and Trademarks*